June 13, 1967 L. BERMAN 3,325,737

RADIO RECEIVER EMPLOYING AN AUTOMATIC FINE TUNING CIRCUIT USING CAPACITANCE DIODES

Filed Sept. 10, 1963 2 Sheets-Sheet 1

INVENTOR
Leon Berman

By Paul M. Craig, Jr.
ATTORNEY

INVENTOR
Leon Berman
By Paul M. Craig, Jr.
ATTORNEY

United States Patent Office 3,325,737

Patented June 13, 1967

3,325,737
RADIO RECEIVER EMPLOYING AN AUTOMATIC FINE TUNING CIRCUIT USING CAPACITANCE DIODES

Léon Berman, Asnieres, Seine, France, assignor to Cit— Compagnie Industrielle des Telecommunications, Paris, France Filed Sept. 10, 1963, Ser. No. 307,872
Claims priority, application France, Sept. 13, 1962, 909,373
3 Claims. (Cl. 325—470)

Figure 1:
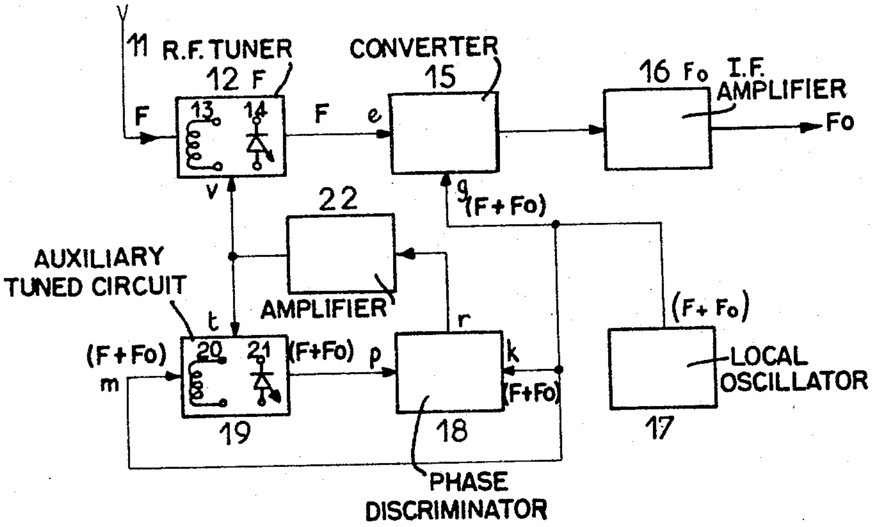

The invention concerns high-frequency wave receivers of the heterodyne type comprising the following fundamental elements:

(1) Circuits tuned to the frequency F to be received.

(2) A local oscillator adjusted to a frequency $(F+F_0)$.

(3) A frequency transporter, which is a non-linear member which receives at one input the frequency F and at another input the frequency $(F+F_0)$ supplied by the local oscillator, and which supplies at its output the fixed frequency $F_0$.

(4) An amplifier connected to the output of the frequency transposer and having a pass band centered on $F_0$, followed by the usual members for the detection and utilization of the modulation of the frequency F.

It is known that in receivers of this type the local frequency corresponding to the reception of a transmitter having a carrier frequency F has a completely defined nominal value $(F+F_0)$ while the tuning circuits have some freedom of adjustment.

According to the invention, the tuning circuit or circuits adjusted to the frequency F received comprises in parallel a varactor (inversely biased diode having a variable capacitance in a certain bias voltage range) subjected to a unidirectional voltage supplied by a phase discriminator which receives at one of its inputs the frequency $(F+F_0)$ emanating directly from the local oscillator, and at its other input a current of like frequency $(F+F_0)$ extracted from the local oscillator, but through an auxiliary circuit tuned to $(F+F_0)$ by means of a varactor which is also subjected to the same unidirectional output voltage of the phase discriminator, the constants and the configuration of the circuits being so chosen that the tuning circuit is adjusted with a good approximation to F when the auxiliary circuit is adjusted to $(F+F_0)$.

Figure 2:
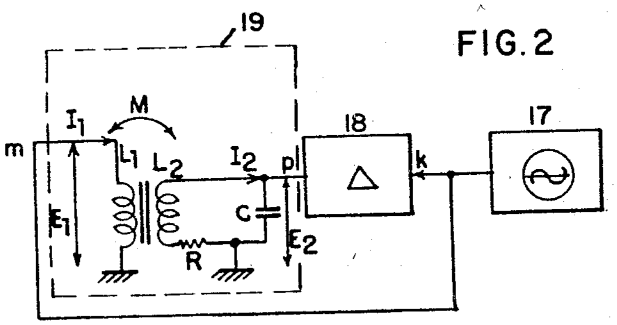
Figure 3:
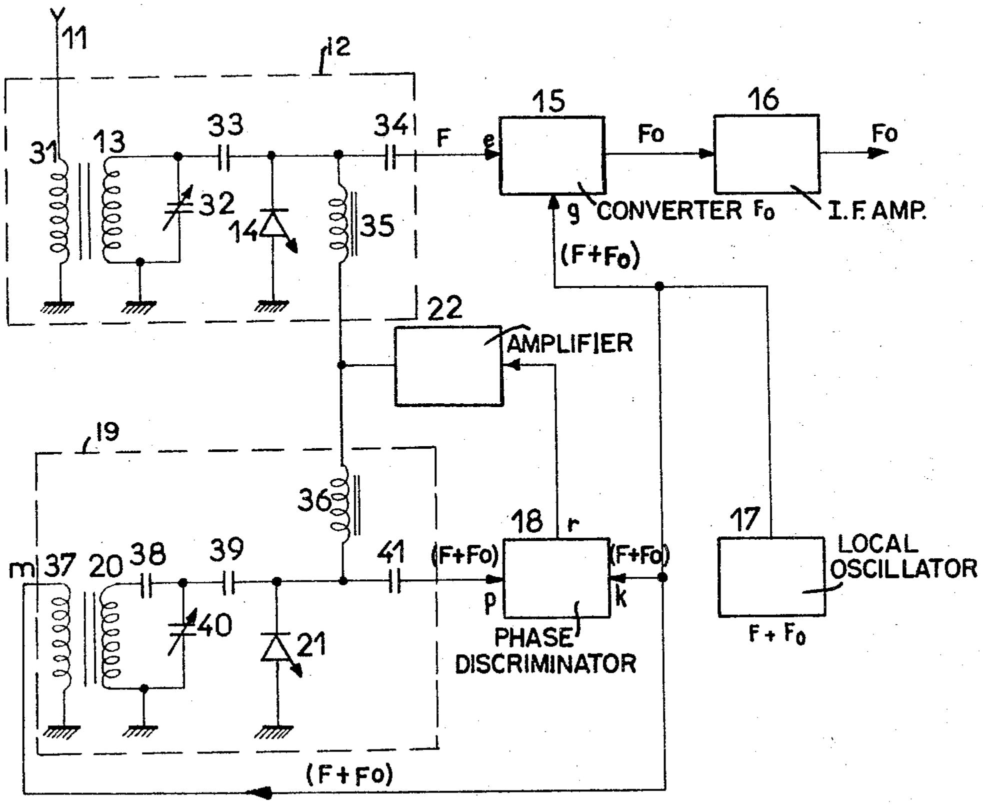

The invention will be described in detail with reference to the accompanying figures wherein like parts in each of the several figures are identified by the same reference numeral; and wherein:

FIGURE 1 is a schematic block diagram of the input stage of a heterodyne radio receiver equipped as proposed by the present invention;

FIGURE 2 is a partial schematic circuit diagram of the auxiliary or second tuned circuit 19 employed in the input stage shown in FIGURE 1; and FIGURE 3 is a schematic circuit diagram corresponding to that of FIGURE 1, but illustrating in a more detailed manner the construction of the first and second tuned circuits 12 and 19.

FIGURE 1 illustrates, in a deliberately very diagrammatic form, but nevertheless clearly enough for the person skilled in the art, the device according to the invention without taking account of the constructional details, which will hereinafter be specified. The waves of radio frequency F are received by the antenna 11 and applied to a first tuned circuit 12, which comprises at least one coil 13 and one varactor 14. The wave F selected by the tuned circuit 12 is applied to the input *e* of the frequency transposer or converter 15, which receives at its other input *g* the frequency $(F+F_0)$ supplied by the local oscillator 17. The transposer 15 supplies a fixed frequency $F_0$, which is applied to the bandpass amplifier 16. The waves amplified by the amplifier 16 are applied to the other members of the receiver, which have been omitted from the figure in order to avoid illustration of very well known devices.

The frequency $(F+F_0)$ is also applied to the input *k* of the phase discriminator 18, as well as to the input *m* of a second or auxiliary tuned circuit 19, which comprises at least one coil 20, a varactor 21 and other capacitances not shown, and which is tuned to the frequency $(F+F_0)$ under the conditions which will hereinafter be explained. The output current of the auxiliary circuit 19 is applied to the second input *p* of the phase discriminator 18. The operation of this member is such that it supplies at its output *r* a unidirectional voltage which is amplified by an amplifier 22 and is applied on the one hand at *t* to the varactor 21, thus effecting the tuning of the auxiliary circuit 19 to $(F+F_0)$, and on the other hand at *v* to the varactor 14, thus effecting the tuning of the circuit 12 to the frequency F.

As is well known, the phase discriminator is a member which, on receiving at two inputs two currents of like frequency, having a phase difference $\phi$ in relation to one another, supplies at its output a unidirectional voltage proportional to cos $\phi$. With appropriate design of the elements and correctly chosen polarity, there is obtained at *p* a voltage which is not in exact quadrature with the voltage at the input *k*, but is out of phase in relation thereto by an angle in the neighborhood of 90°, for example 85° or 86°. Such a phase difference corresponds substantially to the tuning of the circuit 19 to the frequency $(F+F_0)$.

This operation is illustrated in FIGURE 2.

FIGURE 2 diagrammatically illustrates the part of the auxiliary circuit 19 between the output of the local oscillator 17 and the input *p* of the phase discriminator 18.

This part comprises a transformer whose primary winding $L_1$ is connected to the output of the oscillator 17, and consequently receives the voltage $E_1$ supplied by the latter, which voltage gives rise to a current of strength $I_1$.

One of the ends of the secondary winding $L_2$ of the said transformer, having the loss resistance R, is connected to the input *p* of 18 and its other end is connected on the one hand to earth and on the other hand to the terminal *p* by a capacitor C. Under these conditions, a voltage $E_2$ is set up between the terminal *p* and earth, and the winding $L_2$ is traversed by a current of strength $I_2$.

Table 1 below gives the values of the voltages E and $E_2$ as a function of the current $I_1$, of the inductances $L_1$ of the primary winding of the transformer, of the mutual inductance M between the primary and secondary windings, of the pulsation $\omega$ of the voltage $E_1$, and of a quantity $$Q=\frac{1}{CR\omega}$$

TABLE 1

$$\begin{cases} E_1=j\omega L_1I_1+j\omega MI_2 \\ j\omega MI_1+j\omega L_2I_2+RI_2-\frac{j}{\omega C}I_2=0 \end{cases}$$

$$j\underbrace{\left(\omega L_2-\frac{1}{\omega C}\right)}_{(=0)}I_2+RI_2+j\omega MI_1=$$

$$I_2=-\frac{j\omega M}{R}I_1$$

$$E_1=\left(j\omega L_1+\frac{\omega^2M^2}{R}\right)I_1 \qquad \boxed{\begin{array}{l} E_1\approx j\omega L_1I_1 \\ E_2\approx -Q\omega MI_1 \end{array}}$$

$$E_2=-\frac{j}{\omega CI_2}=-\frac{\omega M}{\omega CR}I_1$$

By means well known to the person skilled in the art, it is arranged that when the circuit 19 is adjusted to $(F+F_0)$, the circuit 12 is adjusted to the frequency F. This is the conventional problem of the tracking of heterodyne receivers. It was resolved a long time ago with good approximation in receivers comprising a variable condenser having a number of cages of like capacitance value. Similarly, in the present case, if the varactors 14 and 21 have the same capacitance values for an applied unidirectional voltage (which here performs the function of the mechanical rotation in the variable condenser), it is certain, in principle, that when F varies in a limited range $F_1-F_2$ the circuit 12 will be tuned with good approximation to F, while 19 will be maintained adjusted to $(F+F_0)$ by the action of the discriminator.

It will be seen that the device according to the invention effects automatic adjustment of the tuning circuits of the receiver in a range, without mechanical movement of any member, with substantially zero delay, and with negligible expenditure of energy, as soon as the frequency of the local oscillator has been adjusted to the desired value.

However, it is clear that these advantages can be industrially obtained only if it is possible to obtain readily varactors whose capacitance variations as a function of the unidirectional control voltage are equal to one another with sufficient approximation, in the same way that the tracking of conventional heterodyne receivers is based upon the existence of multi-cage variable condensers, of which the various elements have small differences of capacitance as a function of the rotation of the common shaft. Experience has shown that, despite the usual dispersion characteristics in semiconductor components, it is relatively easy to sort out, with reasonable expenditure, sets of varactors which have, as a function of the unidirectional control voltage, relative capacitance differences of ±1%, that is to say, not higher than those of the elements of a good-quality variable condenser, in a temperature range from −40° C. to +80° C., covering almost all practical cases.

FIGURE 3 illustrates an example of the practical application of the invention to a simple single-range receiver having only one aerial tuning circuit, which comprises the technological elements necessary for the basic diagram of FIGURE 1. The members corresponding to those of FIGURE 1 bear the same reference numerals as in this figure.

The frequency waves F received by the antenna 11 are applied, by means of the primary winding 31, to the tuned circuit consisting of the coil 13, the varactor 14 and the trimming condenser 32. The varactor is disposed between two coupling condensers 33, 34 of relatively high capacitance.

The unidirectional voltage emanating from the phase discriminator 18 is amplified in the amplifier 22 and applied to the varactor 14 through the choke coil 35. The current of frequency $(F+F_0)$ emanating from the oscillator 17 is applied to the input M of the primary winding 37, which is magnetically coupled to the tuned circuit consisting of the winding 20, the series condenser 38, the variable condenser 40 and the varactor 21, which receives the unidirectional voltage through the choke coil

36. The varactor 21 is disposed between the coupling condensers 39 and 41 of relatively high capacitance. The condenser 38, which is the "padding" condenser, and the condenser 40, which is of higher capacitance than the condenser 32, are members known in the art of tracking heterodyne receivers. The varactors 14 and 21 perform the function of the elements of the "variable condenser" as hereinbefore explained.

The device according to the invention may be applied without difficulty to receivers comprising one or more high-frequency amplification stages. It is also applicable to receivers having a number of tuning ranges, by the addition of well known mechanical or electronic switching members.

What is claimed is:

1. In a heterodyne radio receiver comprising a first tuned circuit adapted to be tuned by a varactor diode having variable capacitance controlled by a variable direct current biasing signal applied thereto, means for applying an input signal wave having the frequency F to the input of the first tuned circuit, a local oscillator furnishing a frequency $F+F_0$, a frequency converter having two inputs coupled respectively to the frequency F issuing from the output of the first tuned circuit and to the frequency $F+F_0$ issuing from the output of the local oscillator, said converter supplying a frequency $F_0$ at its output, the improvement comprising a phase discriminator tuned to the frequency of the local oscillator having a first input connected directly to the output of the local oscillator, a second input connected to the output of said local oscillator through a second tuned circuit tuned to the frequency of the local oscillator and adapted to be tuned by means of a second varactor diode having variable capacitance controlled by a variable direct current bias signal supplied thereto, said second tuned circuit producing a phase shift in the local oscillator signal supplied thereto, said phase discriminator serving to produce a direct current signal at its output proportional to the phase shift, and means for applying the direct current signal derived from the phase discriminator to the first and second varactor diodes as bias signals for controlling the tuning of the first and second tuned circuits in a manner such that the first tuned circuit is tuned to the frequency F and the second tuned circuit is tuned to the frequency $F+F_0$.

2. A heterodyne receiver according to claim 1 wherein means are provided for amplifying the direct current signal supplied from the phase discriminator prior to application to the first and second varactor diodes.

3. A heterodyne receiver according to claim 2 wherein the variable direct current bias signals from the phase discriminator are supplied to the first and second varactor diodes through suitable choke coils.

References Cited

UNITED STATES PATENTS

| | | | |
|---|---|---|---|
| 3,201,696 | 8/1965 | Sharp | 325—469 X |
| 3,204,207 | 8/1965 | Denker | 325—468 X |
| 3,233,179 | 2/1966 | Klettke | 325—469 |

KATHLEEN H. CLAFFY, *Primary Examiner.*

R. LINN, *Assistant Examiner.*